(12) United States Patent
Zhan (10) Patent No.: US 12,274,150 B2
(45) Date of Patent: Apr. 8, 2025

(54) DISPLAY DEVICE

(71) Applicant: Wuhan China Star Optoelectronics Semiconductor Display Technology Co., Ltd., Wuhan (CN)

(72) Inventor: Dong Zhan, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/618,573

(22) PCT Filed: Nov. 23, 2021

(86) PCT No.: PCT/CN2021/132331
§ 371 (c)(1),
(2) Date: Dec. 13, 2021

(87) PCT Pub. No.: WO2023/077565
PCT Pub. Date: May 11, 2023

(65) Prior Publication Data
US 2024/0065072 A1    Feb. 22, 2024

(30) Foreign Application Priority Data
Nov. 5, 2021   (CN) .......................... 202111304217.8

(51) Int. Cl.
*H10K 59/65*    (2023.01)
*G06F 1/16*    (2006.01)
*H10K 59/80*    (2023.01)

(52) U.S. Cl.
CPC ........... *H10K 59/65* (2023.02); *G06F 1/1686* (2013.01); *H10K 59/8791* (2023.02)

(58) Field of Classification Search
CPC ........ H10K 59/00; H10K 59/40; H10K 59/59; H10K 59/124; H10K 59/131;
(Continued)

(56) References Cited

U.S. PATENT DOCUMENTS

2014/0217382 A1\* 8/2014 Kwon ................ H10K 50/8426
257/40
2016/0374193 A1\* 12/2016 Namkung ........... G02F 1/13452
(Continued)

FOREIGN PATENT DOCUMENTS

CN    107946341 A    4/2018
CN    110012198 A    7/2019
(Continued)

*Primary Examiner* — Sultan Chowdhury
(74) *Attorney, Agent, or Firm* — Nathan & Associates; Menachem Nathan (57) ABSTRACT

The present invention discloses a display device, comprising: a camera, a display panel and a backplane. The display panel, located on the light incident side of the camera, includes a first display area and a second display area; wherein the second display area is arranged corresponding to the camera. The backplane, located between the camera and the display panel, includes a first backplane and a second backplane; wherein a vertical projection of the second backplane on the display panel covers at least the second display area, and the light reflectivity of the second backplane is less than the light reflectivity of the first backplane.

20 Claims, 7 Drawing Sheets

(58) Field of Classification Search
CPC .. H10K 59/1213; H10K 59/8791; G06F 1/00; G06F 1/16; G06F 1/181; G06F 1/1686; H04M 1/00; H04M 1/0227; H04M 1/0247; H04M 1/0268; H04M 1/0269
See application file for complete search history.

(56) References Cited

U.S. PATENT DOCUMENTS

| | | | | |
|---|---|---|---|---|
| 2018/0286293 | A1* | 10/2018 | Liu | H05K 1/028 |
| 2020/0044003 | A1* | 2/2020 | Cho | G09F 9/30 |
| 2020/0136085 | A1 | 4/2020 | Wang | |
| 2021/0325943 | A1* | 10/2021 | Kwak | H04N 23/45 |

FOREIGN PATENT DOCUMENTS

| | | | |
|---|---|---|---|
| CN | 110244488 | A | 9/2019 |
| CN | 211480033 | U | 9/2020 |
| CN | 111969030 | A | 11/2020 |
| CN | 111999791 | A | 11/2020 |
| CN | 112736120 | A | 4/2021 |
| CN | 112864206 | A | 5/2021 |
| CN | 113066842 | A | 7/2021 |
| CN | 113140158 | A | 7/2021 |
| KR | 20200039422 | A | 4/2020 |

* cited by examiner

DISPLAY DEVICE

FIELD OF INVENTION

The present invention relates to the field of display technology, in particular to a display device.

BACKGROUND OF INVENTION

The Organic Light Emitting Diode (OLED) display device has the advantages of low driving voltage, high luminous efficiency, short response time, high definition and contrast, close to 180° viewing angle, wide operating temperature range, realizable flexible display, large-area full-color display, and many other advantages, so the OLED has been recognized as the most promising display device.

With the development of science and technology and the improvement of people's requirements for products, a full screen with a higher screen-to-body ratio has become a much anticipated trend in the development of smart phones. The under-screen camera technology can hide the camera under the display panel, and the display panel corresponding to the camera area can still achieve normal display, that would be beneficial to increase the screen-to-body ratio so has a broader market prospect. However, this technology still has problems such as the problem of emission light interference, low lighting and poor imaging performance of the emitted light from the light-emitting unit in the display panel.

Therefore, the present application provides a display device, which can effectively solve the problems of emission light interference, low lighting and poor imaging performance of the emitted light from the light-emitting unit in the display panel.

SUMMARY OF INVENTION

The application provides a display device, comprising a camera, a display panel, and a backplane. The display panel, located on the light incident side of the camera, includes a first display area and a second display area; wherein the second display area is arranged corresponding to the camera. The backplane, located between the camera and the display panel, includes a first backplane and a second backplane; wherein a vertical projection of the second backplane on the display panel covers at least the second display area, and the light reflectivity of the second backplane is less than the light reflectivity of the first backplane.

In another embodiment, the light transmittance of the second backplane is greater than that of the first backplane.

In another embodiment, a vertical projection of the first backplane on the display panel covers at least the first display area and the second display area, the second backplane is located on a side of the first backplane close to or away from the second display area, and the second backplane is arranged corresponding to the second display area.

In another embodiment, a groove is formed in a position of the first backplane corresponding to the second display area, and the second backplane is filled in the groove.

In another embodiment, a vertical projection of the first backplane on the display panel covers at least the first display area and the second display area, the second backplane is located on a side of the first backplane close to or away from the second display area, and the second backplane is arranged corresponding to the first display area and the second display area.

In another embodiment, a vertical projection of the first backplane on the display panel covers at least the first display area, an opening is formed on the first backplane at a position corresponding to the second display area, and the second backplane is filled in the opening.

In another embodiment, the hardness of the second backplane is greater than 7HB.

In another embodiment, the light transmittance of the second backplane is greater than 95%, the light reflectivity of the second backplane is less than 1%, and the phase difference of the second backplane is less than or equal to 10.

In another embodiment, the display device further includes an adhesive layer, located between the backplane and the display panel.

In another embodiment, the display device further includes a composite functional layer, disposed between the backplane and the camera, is provided with a light-transmitting hole at a position corresponding to the second display area.

Compared with the prior art, the display device provided by the present application can effectively avoid the influence of the light-emitting unit in the first display area on the lighting of the camera during the display process by making the light reflectivity of the second backplane less than that of the first backplane, so that could improve the imaging performance effectively.

DESCRIPTION OF DRAWINGS

In order to more clearly describe the technical solutions in the embodiments of the present application, the following will briefly introduce the drawings that need to be used in the description of the embodiments. Obviously, the drawings in the following description are only some embodiments of the application, so for those skilled in the art, other drawings can be obtained based on below drawings without heavy creative work.

DETAILED DESCRIPTION OF EMBODIMENTS

The following text will clearly and completely describe the technical solutions in the embodiments of the present application in conjunction with the drawings in the embodiments of the present application; obviously, the described embodiments are only a part of the embodiments of the present application, not all the embodiments. Based on the embodiments in this application, all other embodiments obtained by those skilled in the art without creative work shall fall within the protection scope of this application. In addition, it should be understood that the specific implementations described here are only used to illustrate and explain the application, and are not used to limit the application. In this application, unless otherwise stated, the orientation words used such as "upper" and "lower" usually refer to the upper and lower directions of the device in actual use or working state, or specifically the direction of the drawing in the drawings; the "inner" and "outer" refer to the outline of the device.

The following disclosure provides many different embodiments or examples for realizing different structures of the present application. In order to simplify the disclosure of the present application, the following will describe the components and settings of a specific example; of course, they are only examples, not intended to limit the application. Also, this application may repeat reference numerals and/or reference letters in different examples. Such repetition is for the purpose of simplification and clarity, and does not indicate the relationship between the various embodiments and/or settings discussed. In addition, this application provides examples of various specific processes and materials, but those of ordinary skill in the art may be aware of the application of other processes and/or the use of other materials. The following detailed descriptions are made separately. It should be noted that the order of description in the following embodiments is not intended to limit the preferred order of the embodiments.

The present invention provides a display device, comprising: a camera, a display panel and a backplane. The display panel, located on the light incident side of the camera, includes a first display area and a second display area; wherein the second display area is arranged corresponding to the camera. The backplane, located between the camera and the display panel, includes a first backplane and a second backplane; wherein a vertical projection of the second backplane on the display panel covers at least the second display area, and the light reflectivity of the second backplane is less than the light reflectivity of the first backplane. The display device provided by the present application can effectively avoid the influence of the light-emitting unit in the first display area on the lighting of the camera during the display process by making the light reflectivity of the second backplane less than that of the first backplane, so that could improve the imaging performance effectively.

Figure 1:
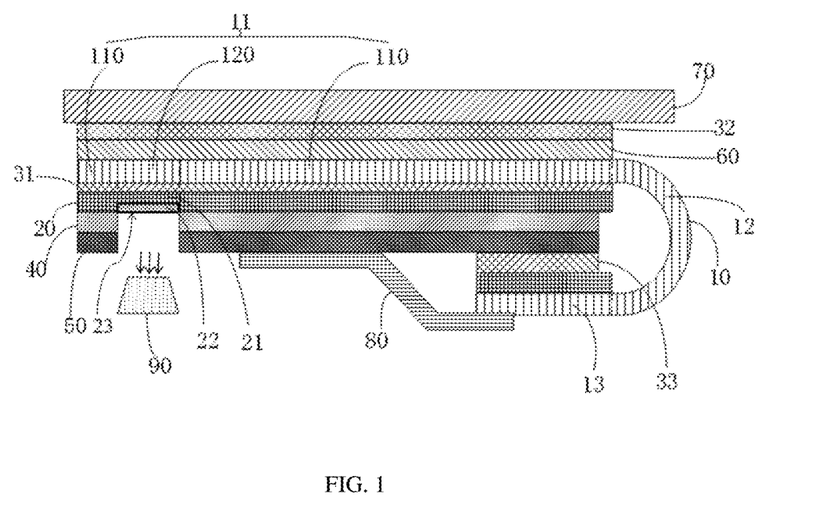
FIG. 1 shows a schematic cross-sectional view of a display device provided by an embodiment of the present application.
Figure 2:
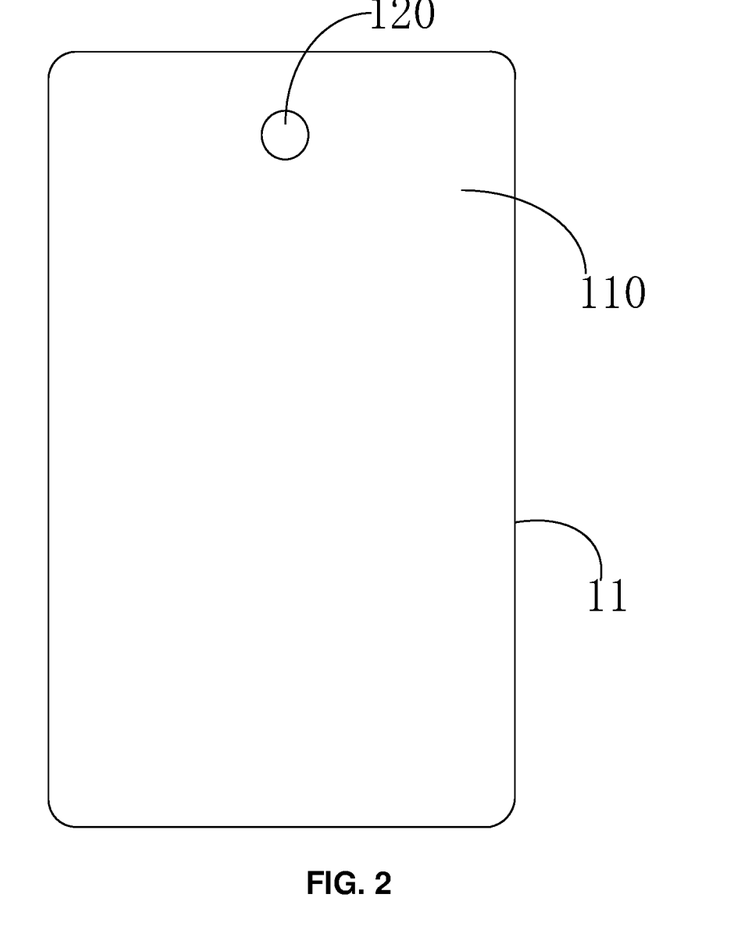
FIG. 2 shows a schematic structural diagram of a display part of a display panel provided by an embodiment of the present application.

In the first embodiment, the FIG. 1 shows a schematic cross-sectional view of a display device provided by an embodiment of the present application, and the FIG. 2 shows a schematic structural diagram of a display panel provided by an embodiment of the present application. As shown in FIG. 1 and FIG. 2, the present application provides a display device with a camera 90, which is used for lighting and imaging. The display device also includes a display panel 10 on the light incident side of the camera 90, wherein the display panel 10 is, for example, a flexible OLED display panel 10 and has a bending or folding function. In FIG. 1, the light incident side can be shown by adopting a plurality of arrows, so as to indicate the position of the light incident side.

In this embodiment, the display panel 10 includes a display part 11, a binding part 13 and a bending part 12; wherein the bending part 12 is arranged between the display part 11 and the binding part 13. The display part 11 of the display panel 10 is provided with a plurality of light-emitting units (not shown in the figure) for performing the display function of the display panel 10; the display part 11 includes a display side and a back side opposite to the displayed side, but an observer could merely observe the screen displayed on the display part 11 on the display side. The bent part 12 of the display panel 10 has a bent state; the binding part 13 of the display panel 10 is provided with electrical components such as a circuit board for driving the display part 11 to display, and is bent and fixed to the back side of the display part 11 by the bending part 12. The display panel 10 can effectively reduce the frame width of the display device by bending the binding part 13 to the back side of the display part 11 to achieve a narrow frame.

In this embodiment, the display panel 10 includes a driving circuit layer and a pixel definition layer disposed on the driving circuit layer; the pixel definition layer is formed with pixel definition openings arranged in an array, and each pixel definition opening is provided with an OLED light-emitting device; the OLED light-emitting device includes a cathode, an anode, and the light-emitting unit located between the cathode and the anode; and the OLED light-emitting device is further provided with an encapsulation layer, and the encapsulation layer may include an inorganic film layer and an organic film layer arranged in a stack.

In this embodiment, the display part 11 includes a first display area 110 and the second display area 120, the first display area 110 is arranged around the second display area 120, and the second display area 120 is arranged corresponding to the camera 90. The display part 11 of the first display area 110 has a display state; the display part 11 of the second display area 120 has a display state or a light-transmitting state. When the display part 11 of the first display area 110 is in the display state and the display part 11 of the second display area 120 is in the display state, the display part 11 of the first display area 110 and the second display area 120 both perform display functions, the camera 90 is turned off, and the display device realizes a full-screen display. When the display part 11 of the first display area 110 is in a display state and the display part 11 of the second display area 120 is in a light-transmitting state, the display part 11 of the first display area 110 performs a display function, and the display part 11 of the second display area 120 does not perform a display function, so that the ambient light can penetrate the display part 11 of the second display area 120 and enter the camera 90 located on the back side of the display part 11, to turn on the camera 90, to realize a photographing function of the display device, and to display a image taken by the camera 90 after transmitting the image to the first display area 110 of the display panel 10.

In this embodiment, the arrangement density of the light-emitting units in the second display area 120 may be less than the arrangement density of the light-emitting units in the first display area 110 to improve the light transmittance of the second display area 120 and to ensure the imaging quality of the camera 90.

In this embodiment, the display device further includes a backplane 20, which, for example, is provided corresponding to the display part 11 and the binding part 13, and the bending part 12 is not provided with the backplane 20 to ensure or to improve the bending performance of the display panel 10 at the bending part 12.

In this embodiment, the backplane 20 includes a first backplane 21 and a second backplane 22. The vertical projection of the first backplane 21 on the display panel 10 covers at least the binding part 13 and the first display area 110 of the display part 11; specifically, the first backplane 21 is arranged corresponding to the first display area 110 of the display part 11, the second display area 120 of the display part 11, and the binding part 13. The vertical projection of the second backplane 22 on the display panel 10 at least covers the second display area 120 of the display part 11; specifically, the second backplane 22 is arranged corresponding to the second display area 120 of the display part 11. Moreover, since the light reflectivity of the second backplane 22 is less than the light reflectivity of the first backplane 21 and the OLED panel is a self-luminous display panel, this application can avoid the light reflection caused by the light emitted from the light-emitting units in the first display area 110 adjacent to the second display area 120 on the backplane 20 corresponding to the position of the camera 90 to improve the imaging performance of the camera 90.

In this embodiment, the light transmittance of the second backplane 22 is greater than the light transmittance of the first backplane 21. The second backplane 22 can effectively increase the amount of incident light that penetrates the backplane 20 and enters the camera 90 to improve the imaging performance of the camera 90.

In this embodiment, the second backplane 22 is arranged on a side of the first backplane 21 away from the display part 11, and the second backplane 22 is arranged corresponding to the second display area 120. Since the backplane 20 has a certain thickness, when the second backplane 22 is arranged on the side of the backplane 20 away from the display part 11, that is the bottommost part of the backplane 20, the backplane 20 can better reduce the reflected light from the light-emitting units of the first display area 110 at the periphery of the second display area 120 onto the backplane 20, so as to improve the imaging performance of the camera 90 and the display performance of the display device corresponding to photo-talking or photo-graphing.

Specifically, a groove 23 is formed on the first backplane 21 at a position corresponding to the second display area 120 and the second backplane 22 is filled in the groove 23, so that could avoid the increase of the overall thickness of the display device due to the arrangement of the second backplane 120 and could increase the light transmittance, also that make the surface of the backplane 20 away from the display part 11 is a flat surface to ensure a good bonding between the film layers on the surface and to avoid the peeling between the film layers when other film layers are formed.

In this embodiment, the hardness of the second backplane 22 is greater than 7HB to improve the supporting of the backplane 20 on the display part 11 of the second display area 120 without damaging the overall performance of the backplane 20.

In this embodiment, the light transmittance of the second backplane 22 is greater than 95%, and the light reflectivity of the second backplane 22 is less than 1%, so as to reduce the light reflectivity and increase the light transmittance of the backplane 20 and to achieve a better image quality of the camera 90.

In this embodiment, the phase difference of the second backplane 22 is less than or equal to 10. By limiting the phase difference of the second backplane 22, the lighting performance of the camera 90 can be effectively improved, so as to reduce or eliminate the phase delay effect on the light corresponding to the second display area 120 and the backplane 20 of the camera 90 and to prevent the display device from generating bright and dark fringes when displaying images of the camera 90.

In this embodiment, the display device further includes a first adhesive layer 31, which is located between the display part 11 and the backplane 20, to fixedly connect the display part 11 and the backplane 20.

In this embodiment, the film layer material of the first backplane 21 is a cycloolefin polymer, which has better light transmittance and a smaller phase difference.

In this embodiment, the film material of the second backplane 22 may be a reflection reduction and antireflection film, which is formed by optical processing of a film material with strong support performance; the second backplane 22 may be formed on the first backplane 21 by magnetron sputtering deposition, sol-gel method or partial attachment.

In this embodiment, the film thickness of the second backplane 22 is from 0.5 μm to 10 μm.

In this embodiment, the display device further includes a composite functional layer disposed between the backplane 20 and the camera 90; the composite functional layer is provided with a light-transmitting hole at a position corresponding to the second display area 120, so the light emitted from the backplane 20 is injected through the light-transmitting hole into the camera 90.

In this embodiment, the composite functional layer includes a foam layer 40 and a metal layer 50, wherein the foam layer 40 is located between the metal layer 50 and the backplane 20, and a second adhesive layer (not shown) could also be provided between the foam layer 40 and the first backplane 21.

In this embodiment, the display device includes a polarizer 60, a third adhesive layer 32, and a cover plate 70, which are sequentially stacked on the display part 11. The polarizer 60 can also be replaced with a color filter or other optical film layer that reduces light reflection. The cover plate 70 is used to seal and protect various elements in the display device to prevent the display device from being damaged by external forces or corroded by external water vapor, etc. Also, the cover plate 70 may be a cover plate made of ultra-thin glass or organic film material, and the cover plate 70 may be flexible or rigid.

In this embodiment, the portion of the first backplane 21 corresponding to the binding part 13 is fixedly connected to the composite functional layer through a fourth adhesive layer 33; a flexible circuit board 80 is further provided at one end of the binding part 13 away from the bending part 12.

Figure 3:
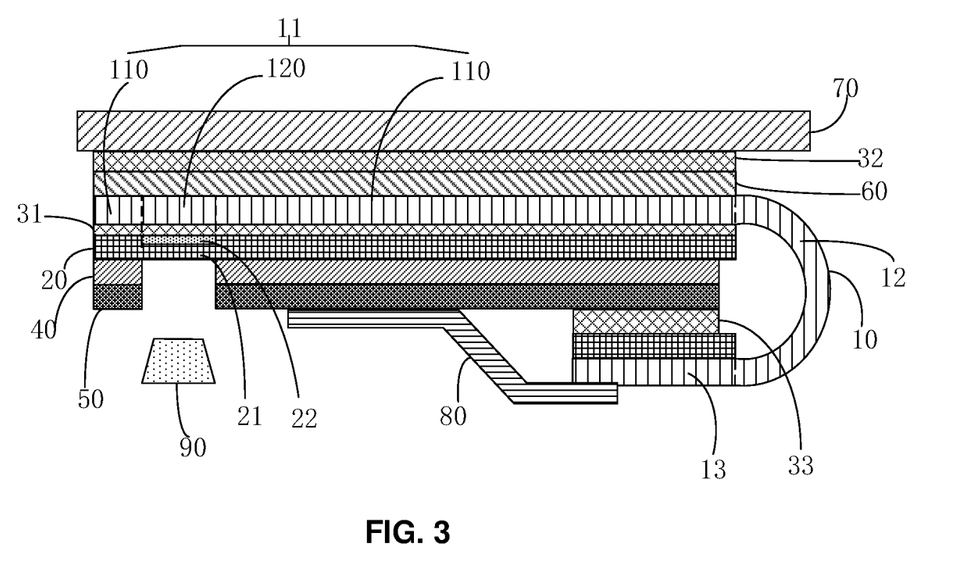
FIG. 3 shows a schematic cross-sectional view of a display device provided by an embodiment of the present application.

In the second embodiment, FIG. 3 shows a schematic cross-sectional view of a display device provided by an embodiment of the present application. As shown in FIG. 2 and FIG. 3, the second embodiment of the present application provides a display device, which is similar in structure to the display device of the first embodiment of the present application, so the same or similar parts will not be repeated in this embodiment; however, the difference between the second and third embodiments is that the second backplane 22 is located on the side of the first backplane 21 close to the display part 11, and the second backplane 22 is arranged corresponding to the second display area 120. Specifically, a groove is formed on the first backplane 21 at a position corresponding to the second display area 120, the notch direction of the groove faces the second display area 120 of the display part 11, and the second backplane 22 is filled within the groove, also that make the surface of the backplane 20 close to the display part 11 is a flat surface to ensure a good bonding between the film layers on the surface and to avoid the peeling between the film layers when other film layers are formed.

In the display device provided in the second embodiment of the present application, the second backplane 22 is arranged closer to the second display area 120 of the display part 11, so as to reduce the reflectivity of the backplane 20, to increase the light transmittance of the backplane 20, and to improve the imaging performance of the camera 90 and the display performance of the display device when displaying the corresponding photo-talking or photo-graphing.

Figure 4:
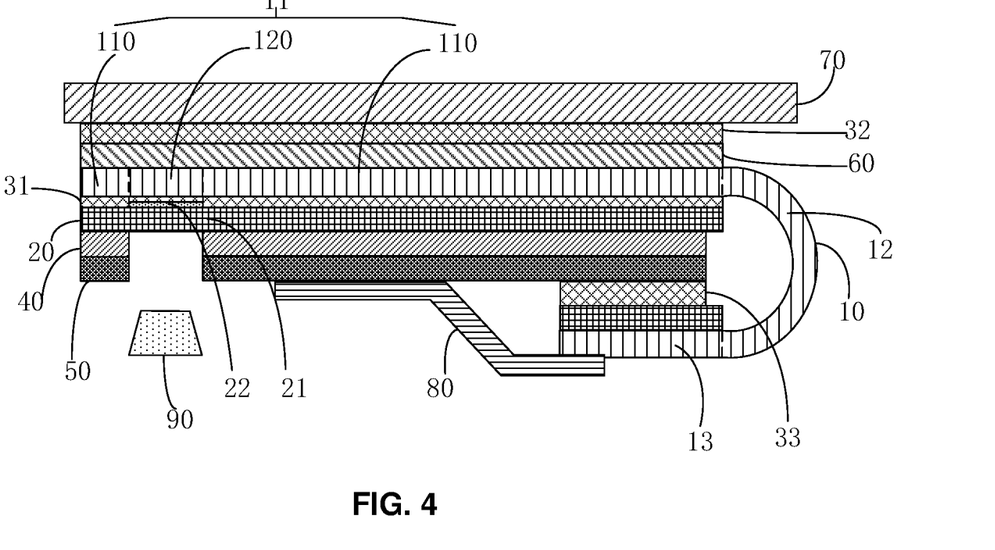
FIG. 4 shows a schematic cross-sectional view of a display device provided by an embodiment of the present application.

In the third embodiment, FIG. 4 shows a schematic cross-sectional view of a display device provided by an embodiment of the present application. As shown in FIG. 2 and FIG. 4, the third embodiment of the present application provides a display device, which is similar in structure to the display device of the second embodiment of the present application, so the same or similar parts will not be repeated in this embodiment; however, the difference is that the two surfaces of the first backplane 21 away from and close to the display part 11 are flat surfaces, the second backplane 22 is arranged on the surface of the first backplane 21 on the side close to the display part 11, a first adhesive layer 31 is filled between the display part 11 and the backplane 20, and the first adhesive layer 31 covers the second backplane 22.

In the display device provided by the third embodiment of the present application, the second backplane 22 is arranged closer to the second display area 120 of the display part 11, so as to reduce the reflectivity of the backplane 20, to increase the light transmittance of the backplane 20, and to improve the imaging performance of the camera 90 and the display performance of the display device when displaying the corresponding photo-talking or photo-graphing.

Figure 5:
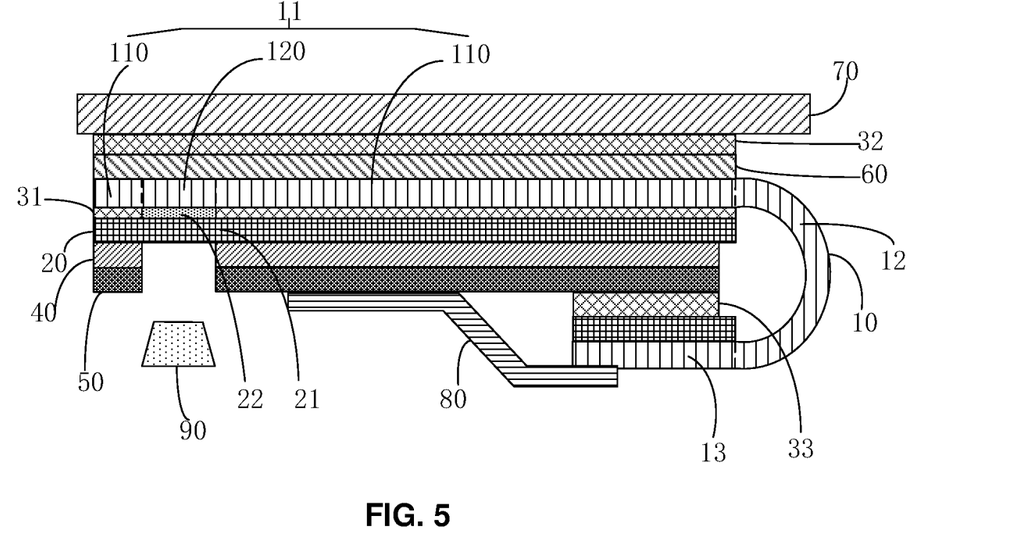
FIG. 5 shows a schematic cross-sectional view of a display device provided by an embodiment of the present application.

In the fourth embodiment, FIG. 5 shows a schematic cross-sectional view of a display device provided by an embodiment of the present application. As shown in FIG. 2 and FIG. 5, the fourth embodiment of the present application provides a display device, which is similar in structure to the display device of the third embodiment of the present application, so the same or similar parts will not be repeated in this embodiment; however, the difference is that the two surfaces of the first backplane 21 away from and close to the display part 11 are flat surfaces, the first adhesive layer 31 does not cover the second backplane 22, and the second backplane 22 penetrates the first adhesive layer 31 and is arranged adjacent to the second display area 120 of the display part 11.

In the display device provided by the fourth embodiment of the present application, the second backplane 22 is arranged closer to the second display area 120 of the display part 11, so as to reduce the reflectivity of the backplane 20, to increase the light transmittance of the backplane 20, and to improve the imaging performance of the camera 90 and the display performance of the display device when displaying the corresponding photo-talking or photo-graphing.

Obviously, in other embodiments of the present application, the second backplane 22 may also be located on the side of the first backplane 21 away from the display part 11, which will not be repeated in this application.

Figure 6:
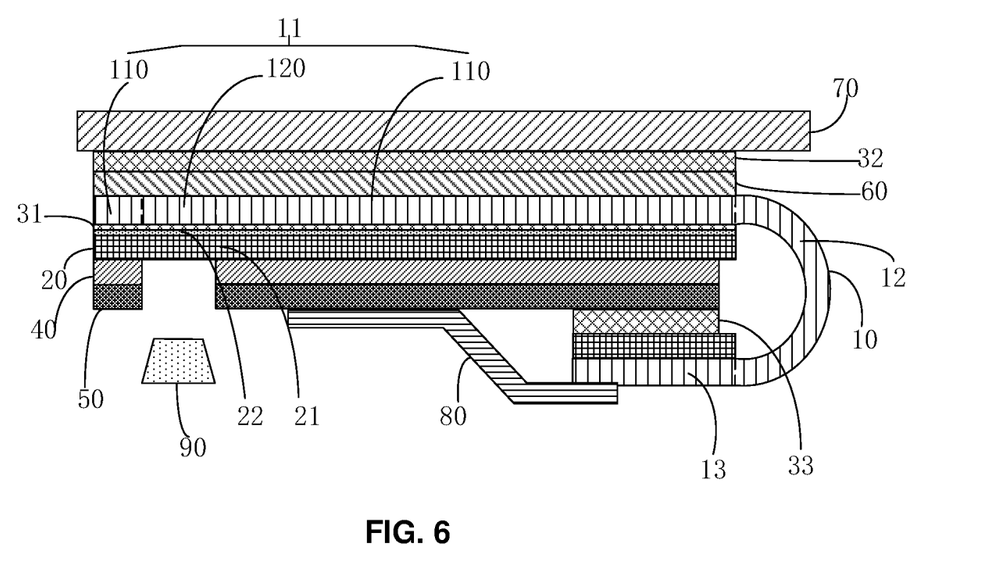
FIG. 6 shows a schematic cross-sectional view of a display device provided by an embodiment of the present application.

In the fifth embodiment, FIG. 6 shows a schematic cross-sectional view of a display device provided by an embodiment of the present application. As shown in FIG. 2 and FIG. 6, embodiment 5 of the present application provides a display device, which is similar in structure to the display device of the third embodiment of the present application, so the same or similar parts will not be repeated in this embodiment; however, the difference is that the vertical projection of the second backplane 22 on the display part 11 directly covers the first display area 110 and the second display area 120, that is, the second backplane 22 is corresponding to the first display area 110 and the second display area 120 of the display part 11.

In the display device provided in the fifth embodiment of the present application, the area of the second backplane 22 corresponding to the display part 11 is expanded to the first display area 110 to increase the area of the second backplane 22 corresponding to the display part 11, so as to reduces the reflected light on the backplane 20 from the light-emitting units on the first display area 110 at the periphery of the second display area 120, and to improve the imaging performance of the camera 90 and the display performance of the display device when displaying the corresponding photo-talking or photo-graphing.

Obviously, in other embodiments of the present application, the second backplane 22 may also be arranged on the side of the first backplane 21 away from the display part 11, which will not be repeated in this application.

Figure 7:
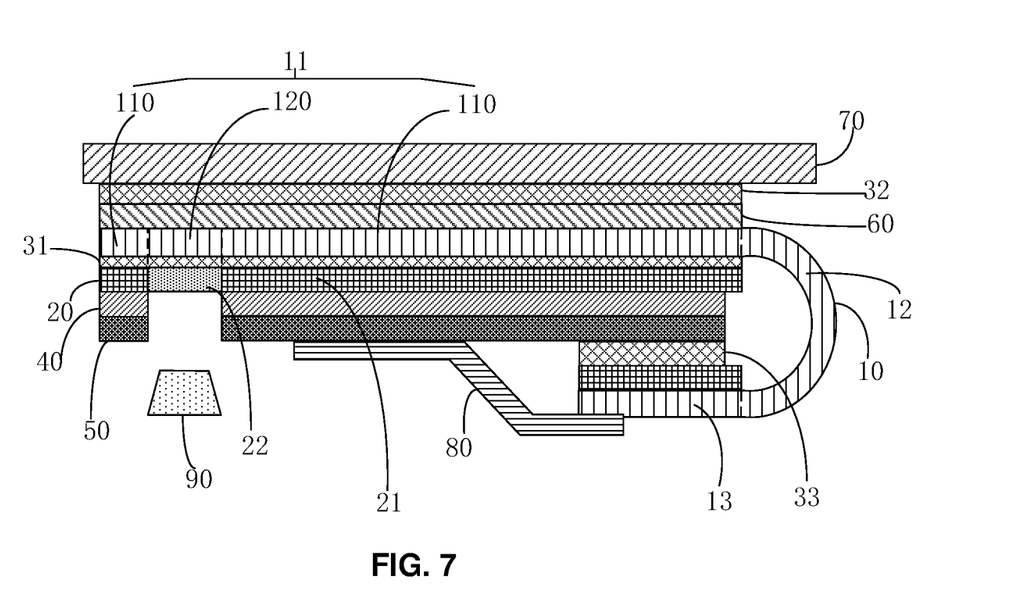
FIG. 7 shows a schematic cross-sectional view of a display device provided by an embodiment of the present application.

In the sixth embodiment, FIG. 7 shows a schematic cross-sectional view of a display device provided by an embodiment of the present application. As shown in FIG. 2 and FIG. 7, a sixth embodiment of the present application provides a display device, which is similar in structure to the display device of the first embodiment of the present application, so the same or similar parts will not be repeated in this embodiment; however, the difference is that: the vertical projection of the first backplane 21 on the display part 11 only covers the first display area 110, forms an opening at a position corresponding to the second display area 120, and fills the second backplane 22 in the opening.

In the display device provided by the sixth embodiment of the present application, the backplane 20 is provided with a second backplane 22 with a higher light transmittance and a lower light reflectivity in an area corresponding to the second display area 120 and the camera 90, so as to significantly reduce the reflected light on the backplane 20 of the light-emitting units on the first display area 110 at the periphery of the second display area 120, to increase the light transmittance of the backplane 20, and to improve the imaging performance of the camera 90 and the display performance of the display device when displaying the corresponding photo-talking or photo-graphing.

To sum up, the present invention provides a display device, comprising: a camera, a display panel and a backplane. The display panel, located on the light incident side of the camera, includes a first display area and a second display area; wherein the second display area is arranged corresponding to the camera. The backplane, located between the camera and the display panel, includes a first backplane and a second backplane; wherein a vertical projection of the second backplane on the display panel covers at least the second display area and the light reflectivity of the second backplane is less than the light reflectivity of the first backplane. By making the light reflectivity of the second backplane smaller than the light reflectivity of the first backplane, the present invention can effectively avoid the influence of the light-emitting unit of the first display area on the lighting of the camera during the display process and improve the imaging performance of the camera and the display performance of the display device during the corresponding photo-taking or photo-graphing.

The above describes in detail a display device provided by an embodiment of the present application. In this article, specific examples are used to illustrate the principles and implementation of the application, but the description of the above examples is only used to help understand the methods and core ideas of the application, and those skilled in the art could modify the specific implementation and the scope of application according to the idea of this application, so the content of this manual should not be construed as a limitation on this application.

What is claimed is:

1. A display device, comprising:
   a camera;
   a display panel, located on the light incident side of the camera, including a first display area and a second display area, wherein the second display area is arranged corresponding to the camera; and
   a backplane, located between the camera and the display panel, including a first backplane and a second backplane, wherein a vertical projection of the second backplane on the display panel covers at least the second display area, the light reflectivity of the second backplane is less than the light reflectivity of the first backplane; and the light reflectivity of the second backplane is less than 1%.

2. The display device according to claim 1, wherein the light transmittance of the second backplane is greater than the light transmittance of the first backplane; and the light transmittance of the second backplane is greater than 95%.

3. The display device according to claim 2, wherein a vertical projection of the first backplane on the display panel covers at least the first display area and the second display area, the second backplane is located on a side of the first backplane close to or away from the second display area, and the second backplane is arranged corresponding to the second display area.

4. The display device according to claim 2, wherein a groove is formed in a position of the first backplane corresponding to the second display area, and the second backplane is filled in the groove.

5. The display device according to claim 2, wherein a vertical projection of the first backplane on the display panel covers at least the first display area and the second display area, the second backplane is located on a side of the first backplane close to or away from the second display area, and the second backplane is arranged corresponding to the first display area and the second display area.

6. The display device according to claim 2, wherein a vertical projection of the first backplane on the display panel covers at least the first display area, an opening is formed on the first backplane at a position corresponding to the second display area, and the second backplane is filled in the opening.

7. The display device according to claim 2, wherein the hardness of the second backplane is greater than 7HB.

8. The display device according to claim 2, wherein the phase difference of the second backplane is less than or equal to 10.

9. The display device according to claim 2, wherein the display device further includes an adhesive layer, located between the backplane and the display panel.

10. The display device according to claim 2, wherein the display device further includes a composite functional layer, disposed between the backplane and the camera, is provided with a light-transmitting hole at a position corresponding to the second display area.

11. The display device according to claim 1, wherein the display panel includes a display part, a binding part, and a bending part located between the display part and the binding part, and the display part includes the first display area and the second display area.

12. The display device according to claim 11, wherein the light transmittance of the second backplane is greater than the light transmittance of the first backplane; and the light transmittance of the second backplane is greater than 95%.

13. The display device according to claim 12, wherein a vertical projection of the first backplane on the display panel covers at least the first display area and the second display area, the second backplane is located on a side of the first backplane close to or away from the second display area, and the second backplane is arranged corresponding to the second display area.

14. The display device according to claim 13, wherein a groove is formed in a position of the first backplane corresponding to the second display area, and the second backplane is filled in the groove.

15. The display device according to claim 12, wherein a vertical projection of the first backplane on the display panel covers at least the first display area and the second display area, the second backplane is located on a side of the first backplane close to or away from the second display area, and the second backplane is arranged corresponding to the first display area and the second display area.

16. The display device according to claim 12, wherein a vertical projection of the first backplane on the display panel covers at least the first display area, an opening is formed on the first backplane at a position corresponding to the second display area, and the second backplane is filled in the opening.

17. The display device according to claim 12, wherein the hardness of the second backplane is greater than 7HB.

18. The display device according to claim 12, wherein the light reflectivity of the second backplane is less than 1%, and the phase difference of the second backplane is less than or equal to 10.

19. The display device according to claim 12, wherein the display device further includes an adhesive layer, located between the backplane and the display panel.

20. The display device according to claim 12, wherein the display device further includes a composite functional layer, disposed between the backplane and the camera, is provided with a light-transmitting hole at a position corresponding to the second display area.

* * * * *